(12) United States Patent
Konrad et al.

(10) Patent No.: US 9,739,826 B2
(45) Date of Patent: Aug. 22, 2017

(54) METHOD AND DEVICE FOR TESTING A WORKPIECE

(71) Applicant: KONRAD GMBH, Radolfzell (DE)

(72) Inventors: Michael Konrad, Radolfzell (DE); Stefan Werner, Radolfzell (DE)

(73) Assignee: KONRAD GMBH, Radolfzell (DE)

( * ) Notice: Subject to any disclaimer, the term of this patent is extended or adjusted under 35 U.S.C. 154(b) by 133 days.

(21) Appl. No.: 14/646,424

(22) PCT Filed: Nov. 21, 2013

(86) PCT No.: PCT/EP2013/074348
§ 371 (c)(1),
(2) Date: Sep. 23, 2015

(87) PCT Pub. No.: WO2014/079913
PCT Pub. Date: May 30, 2014

(65) Prior Publication Data
US 2016/0011253 A1     Jan. 14, 2016

(30) Foreign Application Priority Data

Nov. 21, 2012  (DE) .................. 10 2012 111 215
Nov. 21, 2012  (DE) .................. 10 2012 111 216

(51) Int. Cl.
*G01R 31/28*  (2006.01)
*G01R 1/067*  (2006.01)

(52) U.S. Cl.
CPC ..... *G01R 31/2808* (2013.01); *G01R 1/06705* (2013.01)

(58) Field of Classification Search
CPC combination set(s) only.
See application file for complete search history.

(56) References Cited

U.S. PATENT DOCUMENTS

| | | |
|---|---|---|
| 3,851,249 A | 11/1974 | Roch |
| 4,092,593 A | 5/1978 | Wolk |
| 4,267,507 A * | 5/1981 | Guerpont ........... G01R 1/07314 |
| | | 324/750.25 |
| 4,527,119 A | 7/1985 | Rogers et al. |
| 4,884,024 A | 11/1989 | DiPerna |
| 5,394,100 A * | 2/1995 | Bohler ................. G01R 31/311 |
| | | 324/750.23 |
| 5,635,849 A | 6/1997 | Lo et al. |

(Continued)

FOREIGN PATENT DOCUMENTS

| DE | 2800775 A1 | 7/1979 |
|---|---|---|
| DE | 4416151 C1 | 7/1995 |

(Continued)

OTHER PUBLICATIONS

International Search Report for PCT/EP2013/074348, Apr. 11, 2014.

*Primary Examiner* — Clayton E Laballe
*Assistant Examiner* — Jas Sanghera
(74) *Attorney, Agent, or Firm* — Bachman & LaPointe, PC

(57) ABSTRACT

A method for testing a workpiece (3), in particular a circuit board, by a test pin (2) arranged on a holder (1), the test pin (2) approaching a predetermined position on or in the workpiece (3), a position of the test pin (2) with respect to the holder (1) is intended to be changed.

29 Claims, 6 Drawing Sheets

(56) References Cited

U.S. PATENT DOCUMENTS

| | | | |
|---|---|---|---|
| 5,850,146 A * | 12/1998 | Shim | G01R 1/06705 |
| | | | 324/750.23 |
| 5,867,032 A | 2/1999 | Montoya | |
| 6,051,982 A | 4/2000 | Alcoe et al. | |
| 6,307,389 B1 | 10/2001 | Buks et al. | |
| 7,091,730 B1 | 8/2006 | Parshotam et al. | |
| 8,013,624 B2 | 9/2011 | Namiki et al. | |
| 8,710,855 B2 | 4/2014 | Namiki et al. | |
| 2001/0028254 A1 | 10/2001 | Buks et al. | |
| 2002/0013667 A1 | 1/2002 | Zemer et al. | |
| 2006/0017452 A1 * | 1/2006 | Yamamoto | G01R 31/2812 |
| | | | 324/750.3 |
| 2007/0257685 A1 | 11/2007 | Mochizuki | |
| 2009/0237100 A1 | 9/2009 | Namiki et al. | |
| 2009/0278561 A1 | 11/2009 | Jo et al. | |
| 2009/0302869 A1 * | 12/2009 | Bonin | G01R 1/06794 |
| | | | 324/662 |
| 2010/0066393 A1 | 3/2010 | Bottoms et al. | |
| 2010/0089187 A1 * | 4/2010 | Yin | G01R 1/06722 |
| | | | 73/866.5 |
| 2011/0128023 A1 * | 6/2011 | Nakajima | G01R 3/00 |
| | | | 324/750.03 |
| 2012/0025858 A1 | 2/2012 | Namiki et al. | |

FOREIGN PATENT DOCUMENTS

| | | | |
|---|---|---|---|
| DE | 19503329 A1 | 8/1996 |
| DE | 19646252 A1 | 5/1998 |
| DE | 112006003034 T5 | 10/2008 |
| EP | 0574149 A1 | 12/1993 |
| FR | 2356341 A1 | 1/1978 |

\* cited by examiner

METHOD AND DEVICE FOR TESTING A WORKPIECE

BACKGROUND OF THE INVENTION

The invention relates to a method for testing a workpiece, in particular a printed circuit board, by means of a testing pin arranged on a holder, which testing pin approaches a predetermined position on or in the workpiece, and a device for this purpose. The invention also relates in general to a method for moving an object, in particular an electrical or electronic object or a part thereof, in particular for testing, examining, and/or processing a workpiece, in particular an electronic workpiece, by means of an item of equipment.

Objects must be moved in many cases in daily life. Reference is made hereafter to electronic testing devices solely as an example. However, the present invention is not to be restricted thereto. The description is only to be considered to be an example. The present invention also relates to movements, which take place in miniature ranges, in a nonrestrictive manner. It is particularly well suited to this purpose.

Such testing devices are known and are on the market in manifold forms and embodiments. The present invention relates to any testing device, using which a workpiece is to be scanned by a plurality of testing pins, which are arranged in a specific relationship to one another, but this arrangement must possibly be changed. Above all, but not exclusively, the present invention relates to testing devices for studying electronic printed circuit boards for faults and function before installation in electronic devices.

In such devices, contact pins or needles are pressed against predetermined points (contact positions) of the printed circuit board, and then testing signals are applied thereto in accordance with a predetermined control by a testing computer, to ascertain the functional capability of the equipped printed circuit board. To produce a perfect electrical contact between the contact needles and contact points on a printed circuit board, which taps a large number of contact positions, several thousand contact needles are often necessary or possible.

Such testing devices are described, for example, in DE 11 2006 003 034 T5 or also DE 196 46 252 A1 or DE 44 16 151 B. However, all of these devices presume that the printed circuit boards to be tested are exactly associated with the testing pins. Since a plurality of such tests must also take place within one time unit, substantial problems occur during the positioning of the printed circuit board in relation to the testing pins.

A frequently occurring problem in the case of such a testing device, in particular for printed circuit boards, is that the workpiece to be tested must subsequently be altered. This means that the testing adapter having the testing pins must also subsequently be redesigned, which takes a long time since, for example, angle of approach and arrangement of the testing pins in relation to one another must be recalculated and the corresponding holders, for example, perforated plates, must also be redesigned.

The object of the present invention is to develop a method and a device of the above-mentioned type, using which an alteration of the arrangement of the testing pins in relation to one another is made easier and in particular accelerated. The object of the present invention is also to improve the movement of an object, above all in the field of electronics, but also in micro-mechanics.

SUMMARY OF THE INVENTION

The object is achieved in that a location of the testing pin is varied in relation to the holder.

The basic idea of the present invention is therefore to arrange the testing pins so they are movable on or in the corresponding holders. If the points or locations of the points to be approached by the testing pin change on the workpiece, this change is thus to be taken into consideration by a simple change of the location of the testing pin approaching the corresponding point. No new boreholes have to be created in the holder, for example, and new angles or the like do not have to be calculated.

In a simple exemplary embodiment of the invention, the variation of the location of the testing pin in relation to the holder can be performed manually and mechanically. Many possibilities are conceivable for this purpose, which are in the scope of the present invention. For example, the testing pin can be designed so that its testing tip can assume another location by rotating the testing pin in a perforated plate. This applies in particular to a testing tip which is arranged eccentrically in relation to the actual shaft of the testing pin.

For example, however, the holder or a recess in the holder (in particular in the perforated plate) can also be designed so that a location change of the testing pin is possible. An oblong hole is considered here, for example.

Another possibility is the location change of the testing pin by way of corresponding magnets or by way of a corresponding magnetization. The testing pin is easily fixed removably on the holder by the magnet. The magnet itself can be moved, for example, lifted and/or rotated, by appropriate magnetization or another magnet. The testing pin follows this movement.

However, the possibility of the movement by way of a magnet also opens up the possibility of not guiding the testing pin directly in the holder, for example, in a perforated plate, but rather only fixing the testing pin on a lower side of a plate. The testing pin can then be displaced on the lower side into an arbitrary location, which can again be performed manually or also by a magnet provided on the upper side of the plate. A rotation of the testing pin is also readily possible.

A third possibility of great interest for the movement of the testing pin, for which protection is sought in general in the scope of the present invention, however, is the arrangement of intrinsically active polymers around the testing pin. Intrinsically active polymers are plastics which, upon the action of specific physical (for example, temperature, light of specific wavelength, electrical and magnetic field variables) or chemical (material concentration, pH value) environmental variables, change material properties in a defined manner. Above all, these are phase-reversible polymers (for example, stimuli-sensitive hydrogels, polymer brushes), phase-variable polymers, conductive polymers, and bielectric elastomers. Further representatives of the intrinsically active polymers are shape-memory polymers, piezoelectric polymers, electrostrictive polymers, and ferroelectric polymers.

The present invention uses above all so-called stimuli-sensitive hydrogels. These materials are solid-state effect carriers having the greatest volume change usable as an actuator and can therefore be miniaturized extraordinarily well.

Temperature-sensitive poly-(N-isopropyl acrylamide) (PNIPAAm) is used as a base.

In a first step according to the present invention, the mechanical and actuator properties of the actuator material are tailored to specified drive tasks. The mechanical stresses to be expected will exceed the achievable properties of the homopolymer PNIPAAm. Therefore, the polymer is functionalized using special nanomaterials from the group of layered silicates, which results in an improvement of the mechanical-actuator hydrogel properties by more than one order of magnitude. The parameter optimization of the active polymer is performed by variation of the cross-linking conditions and specific modification of the starting materials, the degree of cross-linking, and the porosity of the cross-linking points.

Furthermore, the controllability of the actuator materials was optimized. In the unmodified state, the hydrogel actuators may be switched from the completely swollen to the completely non-swollen state by variation of the actuator temperature by only 5° K in the range of their volume phase transition. To carry out the actuator control with high precision, the need can arise for expanding the volume phase transition range to 10° K, for example. This is achievable, on the one hand, by co-polymerization of the N-isopropyl acrylamide, but, on the other hand, also by the variation of the thermodynamic quality of the solvent.

In addition, the actuator material is to be able to be micro-structured. For this purpose, a radical photopolymerization is used according to the invention, using which the hydrogel is not only synthesized, but rather also microstructured in a shaping manner.

A further aspect is the integration capability of the actuator material in a higher-order system. On the one hand, the required material compatibilities are to be ensured here, on the other hand, suitable adhesion promoter systems for the covalent adhesion are to be found.

A device or a positioning drive for carrying out the method is conceived as a compact, fully integrated system and comprises the following assemblies:
(i) at least one actuator,
(ii) actuator control electrodes,
(iii) a locking mechanism,
(iv) a drive housing including mechanical interfaces,
(v) at least one interface to higher-order systems, and
(vi) a hardware-based and software-based controller of the positioning drive.

Above all, applying these polymers in the screen printing method to a holder, so that they can enclose the corresponding testing pins therein, is in the scope of the present invention. If they are then confronted or impinged with a corresponding physical or chemical environmental variable, they change their location in a defined manner like a muscle and move the testing pin at the same time.

Overall, of course, observing the changes of the testing pins as precisely as possible is conceived. This is performed by corresponding cameras, wherein it is conceived above all in the scope of the present invention that the testing pin is guided directly through an objective of the camera, so that this camera can observe the movement of the testing pin as precisely as possible.

BRIEF DESCRIPTION OF THE DRAWINGS

Further advantages, features, and details of the invention result from the following description of preferred exemplary embodiments and on the basis of the drawing; in the drawing

DETAILED DESCRIPTION

Figure 1:
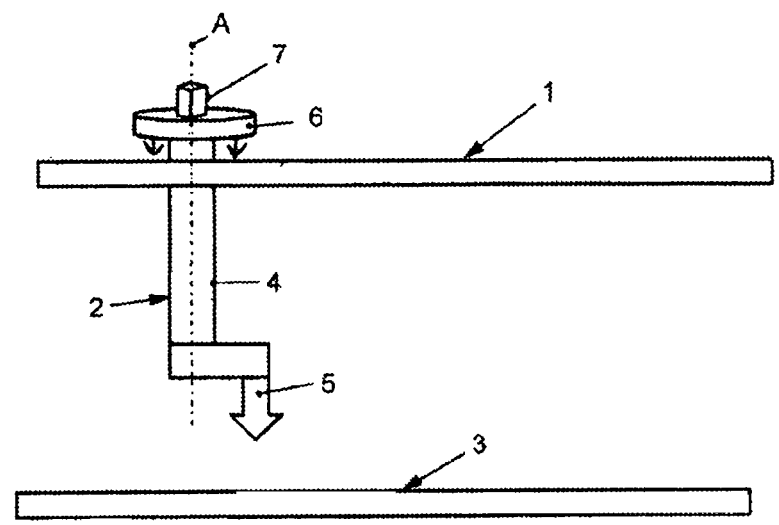
FIG. 1 shows a schematic side view of a part of a device according to the invention for testing a workpiece.

According to FIG. 1, a testing pin 2 is located on a holder 1, wherein it is to be presumed, of course, that generally a plurality of such testing pins 2 is provided on this holder 1. A printed circuit board 3 is to be tested using this testing pin 2.

In the present exemplary embodiment, the testing pin 2 penetrates the holder 1, which is implemented as a perforated plate, with a shaft 4. This shaft 4 is arranged in a corresponding recess in the perforated plate 1 so it is rotatable around an axis A. A testing tip 5 is located eccentrically in relation to this axis A, which testing tip can be varied in its location in relation to the workpiece (printed circuit board 3) upon rotation of the shaft 4. Of course, it is additionally possible to also implement the recess in the perforated plate 1, which is penetrated by the shaft 4, accordingly, so that the location of the testing tip 5 can additionally be changed. For example, the recess could be an oblong hole or the like.

A magnet 6 is provided on the shaft 4 for fixing the testing pin 2 in relation to the perforated plate 1. In this case, the perforated plate 1 is preferably implemented as at least partially magnetic, so that an attractive force acts between the magnet 6 and the perforated plate 1, as indicated by the arrows.

In a simple exemplary embodiment, the rotation of the shaft 4 is performed by a wrench (not shown in greater detail), which can be applied to an adjustment auxiliary square 7. If a different location of the testing tip 5 in relation to the printed circuit board 3 is therefore desired, the testing pin 2 can thus be rotated around its axis A by the wrench and the testing tip 5 can be moved in a circle. Simultaneously or additionally, it is also considered that either the perforated plate 1 and/or the printed circuit board 3 is moved two-dimensionally in the horizontal, so that the testing tip 5 can thus approach every point on the printed circuit board 3. Such a movement mechanism for the printed circuit board 3 is disclosed, for example, in DE 10 2012 106 291.9.

Figure 2:
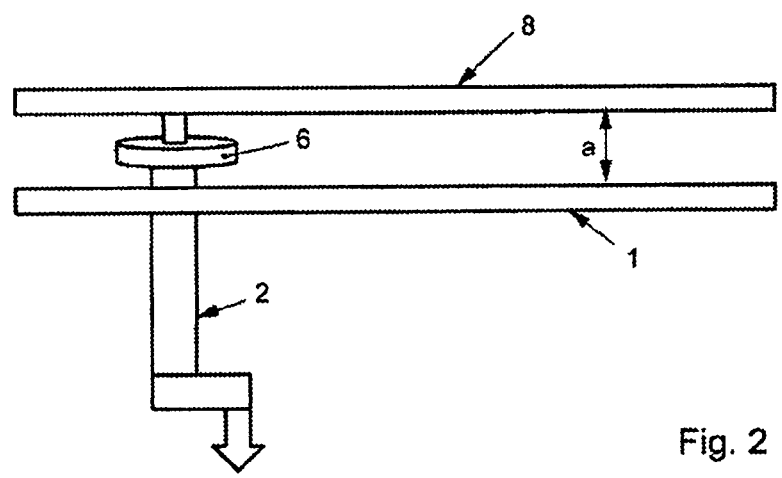
FIGS. 2-5 show schematic side views of further exemplary embodiments of devices according to the invention for testing workpieces.

In the exemplary embodiment of a device according to the invention for testing a workpiece according to FIG. 2, a fixing plate 8 is additionally associated with the perforated plate 1, wherein a spacing a between perforated plate 1 and fixing plate 8 is variable. This fixing plate 8 has the task, inter alia, of fixing the individual testing pins 2 in relation to the perforated plate 1 after they are adjusted, i.e., it essentially assists the magnet 6 so that the testing pins 2 are not lifted off the perforated plate 1 during the lowering toward the printed circuit board 3 and the location of the testing pins 2 is unintentionally changed.

Figure 3:
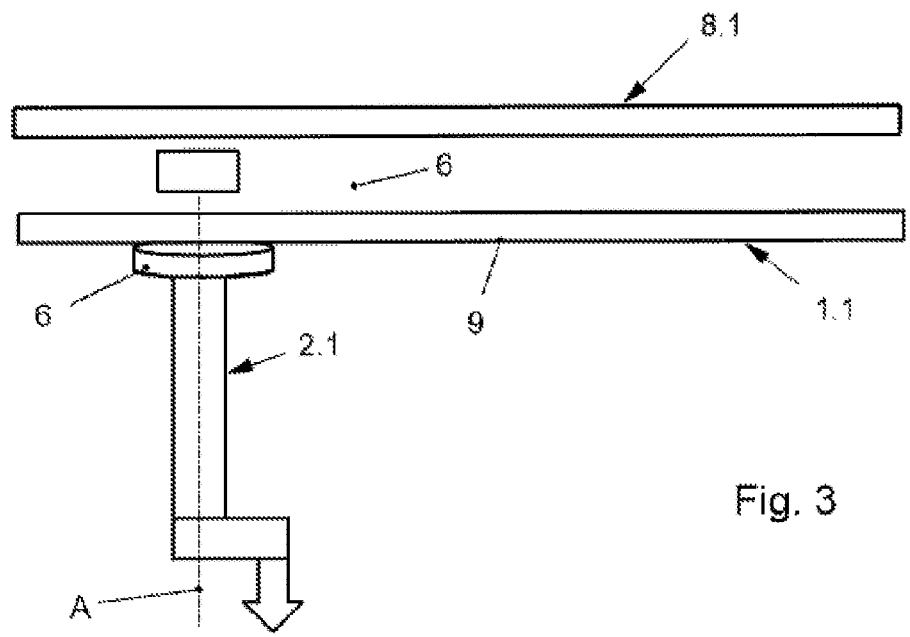

In the exemplary embodiment of a device according to the invention for testing workpieces according to FIG. 3, a semi-magnetic plate is used instead of a perforated plate as the holder 1.1. This means that the fundamental position of the testing pins 2.1 is not dependent on the hole grid of a perforated plate in this case, but rather the testing pin 2.1 can be moved freely along a lower side 9 of the holder 1.1.

A rotation of the testing pin 2.1 around its axis A is caused by a drive magnet 10, which is associated with the holder 1.1 beyond the testing pin 2.1. This drive magnet 10 can be moved along the holder 1.1 in any arbitrary direction, but also rotated, so that the magnet 6 follows it and an alignment of the testing pin 2.1 in relation to a printed circuit board (not shown) can be performed.

A magnetically conductive fixing plate 8.1, using which the entire arrangement can be fixed, is also provided above the drive magnet 10.

Figure 4:
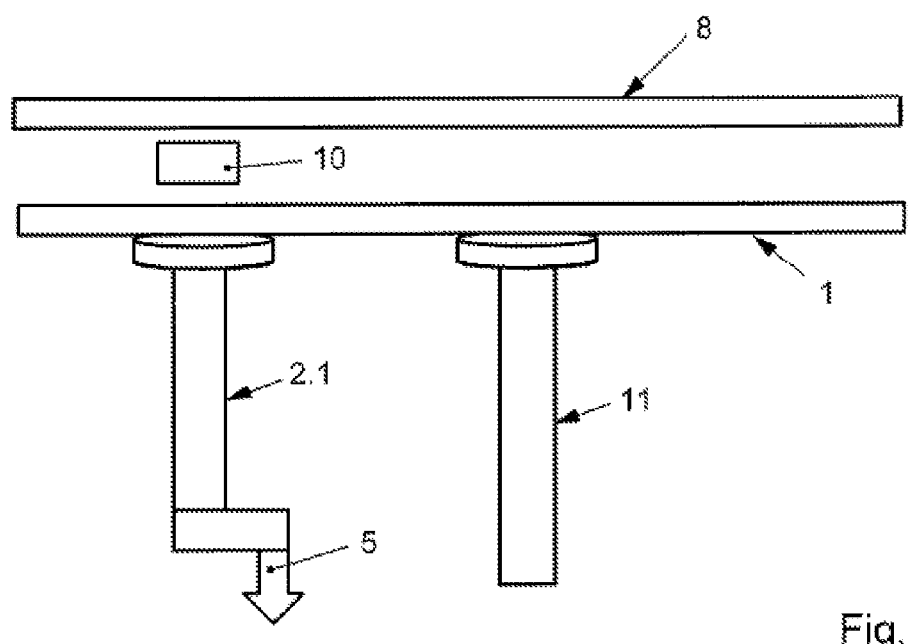

The embodiment of a device according to the invention for testing a workpiece according to FIG. 4 differs from that according to FIG. 3 only by way of the arrangement of an additional tool 11, using which a further activity can be performed. For example, this can be a spring-loaded hold-down in this case, which presses on the workpiece, or also a camera, which observes the testing tip 5.

Figure 5:
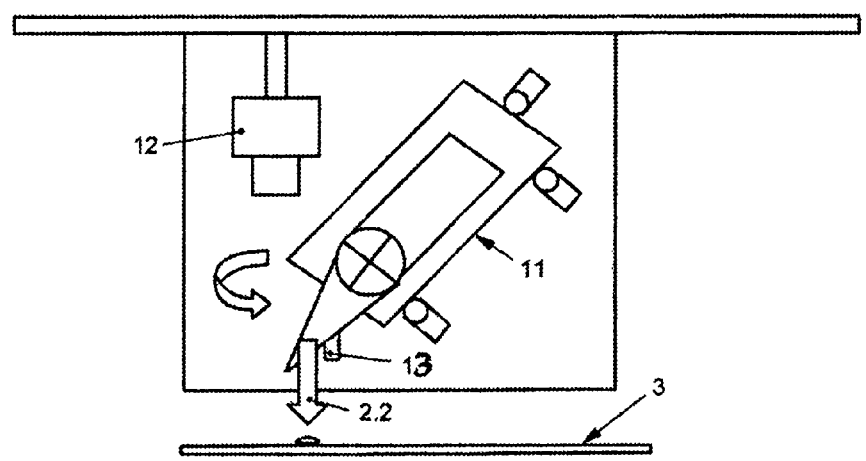

In a further exemplary embodiment of a device according to the invention for testing a workpiece 3 according to FIG. 5, the testing pin 2.2 is located on a carriage 11, which can be moved arbitrarily. Reference is again made to DE 10 2012 106 291.9 here only as an example. The movement of the carriage 11 or the location of the testing pin 2.2 in relation to the printed circuit board 3 can be observed and monitored by a separate camera 12 and/or also by a camera 13 associated with the carriage 11.

Figure 6:
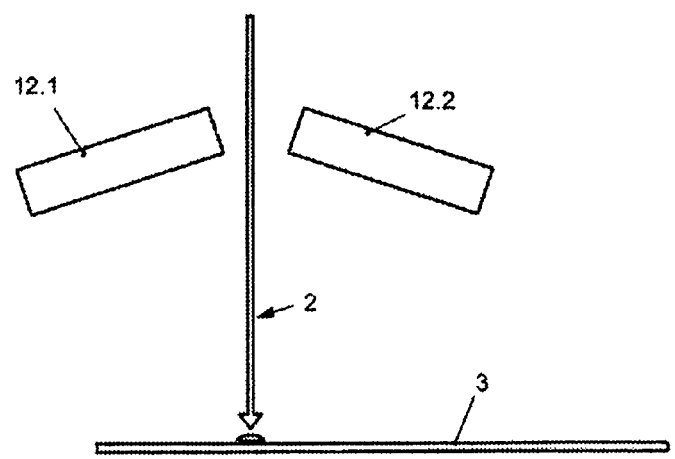
FIG. 6 shows a schematic side view of an arrangement for observing testing pins.

It is indicated in FIG. 6 that the activity of the testing pin 2 is observed by two inclined cameras 12.1 and 12.2.

Figure 7:
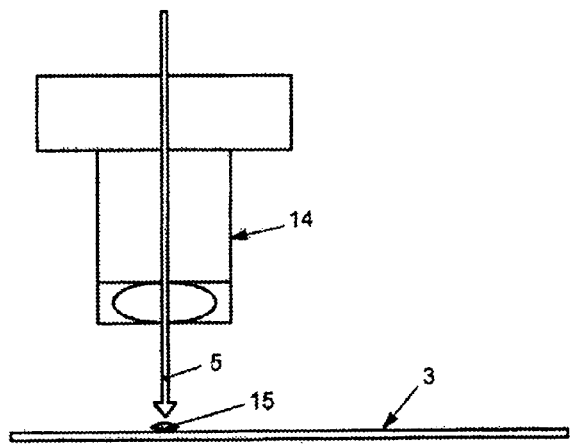
FIG. 7 shows a schematic side view of a further arrangement for monitoring the activity of testing pins.
Figure 8:
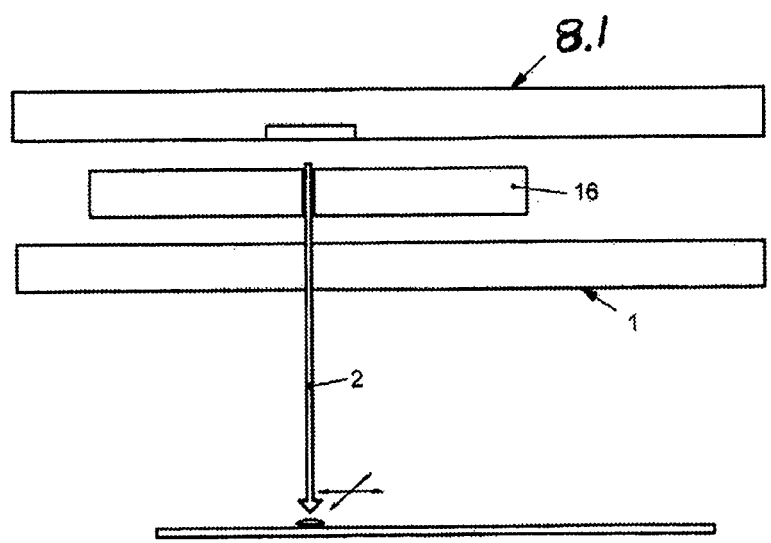
FIG. 8 shows a schematically illustrated side view of a further exemplary embodiment of a part of a device for testing a workpiece.

However, the exemplary embodiment according to FIG. 7 is also particularly in the scope of the invention, according to which the testing pin 2 or a testing tip 5 directly penetrates the objective 14 of a camera, so that this objective 14 is aligned directly on a point of incidence 15 of the testing tip 5 on the printed circuit board 3.

A special embodiment of the present invention is shown in FIGS. 8 to 13. It relates in this case to the possibility of moving a testing pin 2 by means of electroactive polymers 16, which act as actuators for the testing pin 2.

FIGS. 9 to 13 show a further possibility for moving the testing pins 2, which is caused by so-called intrinsically active polymers. They move similarly to muscles. Above all electroactive polymers (EAP) are preferred for the present inventive idea, since the polymer can be influenced directly and in a targeted manner by means of an electrical field variable.

Figure 9:
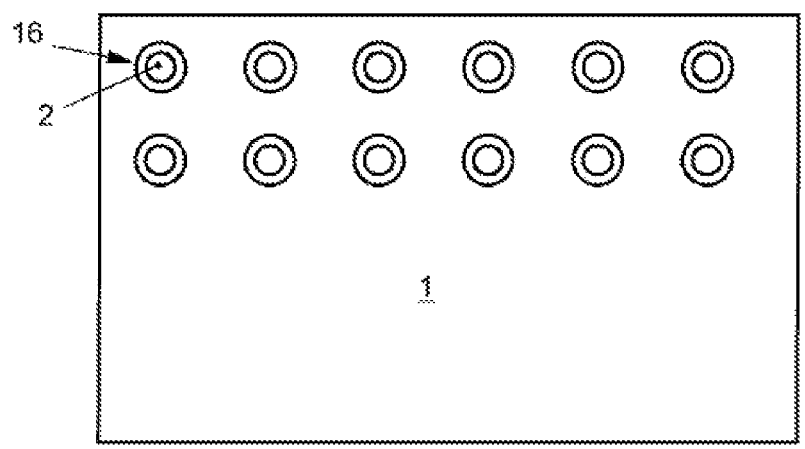
FIG. 9 shows a top view of a holder for testing pins.
Figure 10:
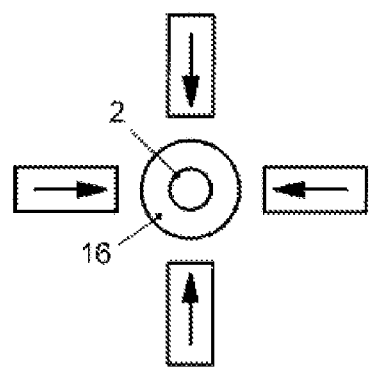
FIGS. 10 and 11 show a schematically illustrated top view and side view of a portion of FIG. 9 with electroactive polymer activators.
Figure 11:
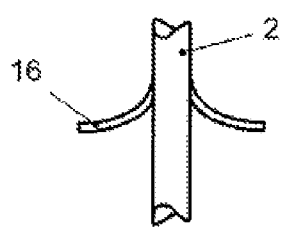

According to FIG. 9, a corresponding testing pin 2 is guided in a perforated plate 1. EAP actuators, which engage on the testing pin 2, are located on or above the perforated plate 1. This is schematically shown above all in FIGS. 10 and 11. The corresponding EAP actuator encloses the testing pin 2, wherein an electrical field variable is applied on four sides to the EAP actuator 16 itself according to FIG. 10. For example, this causes a middle region of the EAP actuator to bulge and to lift up the testing pin 2 at the same time, as shown in FIG. 11. A rotation of the testing pin 2 can also be caused by appropriate application of the electrical field variable to the EAP actuator.

Figure 12:
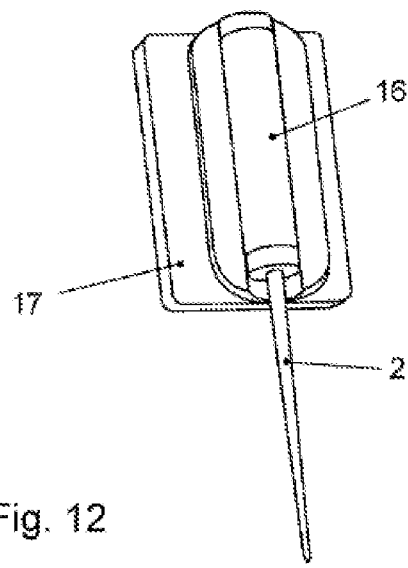
FIG. 12 shows a top view, illustrated in perspective, of a schematic structure of a multiaxial positioning drive.
Figure 13:
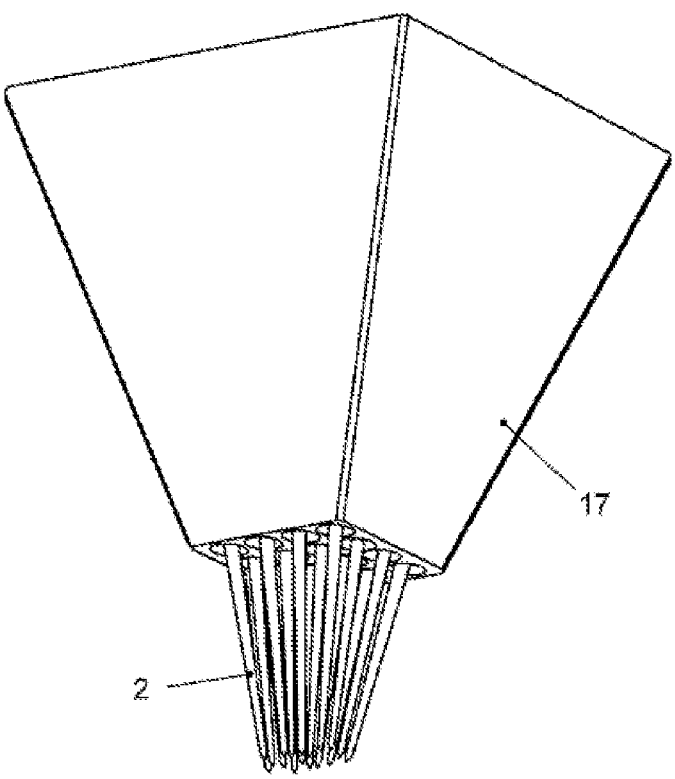
FIG. 13 shows a side view, illustrated in perspective, of a contact needle head according to the invention.

FIGS. 12 and 13 show how a corresponding testing pin 2 is integrated in a housing 17, wherein the testing pin 2 is enclosed by an EAP actuator 16 in the upper region or inside the housing 17.

In this case, a plurality of testing pins 2 protrude out of the housing 17. These contact needles or testing pins 2 are collected by a polymer reactor 16, which is embedded in the housing 17.

This hydrogel-based actuator has the task of adjusting the contact needles freely in the x-y plane with maximum positioning distances of +/−500 μm starting from the normal position with a positioning precision of approximately 25 μm. This complicated multiaxial positioning may be implemented with a flexible solid-state reactor, which deforms in an analogous way upon appropriate activation so that it can approach any arbitrary point in the positioning plane via the contact needles. This requires finding a suitable constructive design and dimensioning. The achievable positioning precision is additionally determined by the performance of the actuator control electrodes. The resistive control electrodes are segmented and implement a control of the temperature field, which is electronically rotatable around 360°. Essential examination criteria are the required number of electrodes to be able to position the contact needles sufficiently precisely, the required heating power, the curve of the heating field, the heat coupling, and the heat management for stabilizing the controlling temperature field.

The contact needle positioning drive is only responsible for the actual positioning procedure. If the contact needles have reached their end position, a locking mechanism is activated, which fixes the needles in their position.

It is to be ensured during the needle positioning that the head has a uniform, defined temperature in the region of the positioning drives, to ensure the independence of the positioning procedures from possible variations of the ambient temperature. The active temperature management may be implemented, for example, by Peltier elements or active water cooling.

The drive housing not only ensures the mechanical protection of the positioning drive, but rather also carries its mechanical and electrical interfaces.

The head must additionally have adjustment capabilities, to be able to adjust or pre-position it optimally. In the ideal case, a global adjustment may be implemented for the positioning drives, alternatively, concepts of individual adjustment are studied.

Above all, friction-locked principles appear suitable for the locking mechanism.

The invention claimed is:

1. A method for testing a printed circuit board, comprising arranging a testing pin (2) on a holder (1), moving the testing pin (2) to a predetermined position relative to the printed circuit board, and varying a location of the testing pin (2) relative to the holder (1), wherein a variation of the location of the testing pin (2) in relation to the holder (1) is performed by intrinsically active polymers.

2. The method as claimed in claim 1, wherein the intrinsically active polymers are applied to the holder (1) in a screen printing method.

3. The method as claimed in claim 1, wherein the variation of the location of the testing pin (2) is observed.

4. A device for carrying out the method of claim 1, comprising:
 (i) at least one actuator (16),
 (ii) actuator control electrodes,
 (iii) a locking mechanism,
 (iv) a drive housing including mechanical interfaces,
 (v) at least one interface to higher-order systems, and
 (vi) a hardware-based and software-based controller of a positioning drive.

5. A method for testing a printed circuit board, comprising arranging a testing pin (2) on a holder (1), moving the testing pin (2) to a predetermined position relative to the printed circuit board, and varying a location of the testing pin (2) relative to the holder (1), wherein the variation of the location of the testing pin (2) is observed in that the testing pin (2) is guided through the objective (14) of a camera.

6. The method as claimed in claim 5, wherein a variation of the location of the testing pin (2) in relation to the holder (1) is performed mechanically.

7. The method as claimed in claim 5, wherein a variation of the location of the testing pin (2) in relation to the holder (1) is performed magnetically.

8. The method as claimed in claim 5, wherein a variation of the location of the testing pin (2) in relation to the holder (1) is performed by intrinsically active polymers.

9. The device as claimed in claim 5, wherein the testing pin (2) is implemented eccentrically, wherein a tip (5) of the testing pin is arranged offset in relation to an axis of rotation (A).

10. The device as claimed in claim 9, wherein at least one magnet (6) is associated with the testing pin (2), which fixes it on the holder (1).

11. The device as claimed in claim 10, wherein a drive magnet (10) is associated with the magnet (6) for its movement.

12. The device as claimed in claim 11, wherein a magnetically conductive fixing plate (8) is associated with the drive magnet (10).

13. The device as claimed in claim 12, wherein the holder (1) is implemented as at least semi-magnetic.

14. The device as claimed in claim 13, wherein a tool (11) comprising a spring-loaded holddown, is fixed on the holder (1).

15. A device for testing a printed circuit board comprising a testing pin (2) arranged on a holder (1), and including means for varying a location of the testing pin (2) variable to the holder (1), wherein the testing pin (2) is implemented eccentrically, wherein a tip (5) of the testing pin is arranged offset in relation to an axis of rotation (A), wherein at least one magnet (6) is associated with the testing pin (2), which fixes it on the holder (1), wherein a drive magnet (10) is associated with the magnet (6) for its movement, and wherein a magnetically conductive fixing plate (8) is associated with the drive magnet (10).

16. The device as claimed in claim 15, wherein the testing pin (2) at least partially penetrates a perforated plate.

17. The device as claimed in claim 15, wherein an at least two-dimensionally movable carriage (11) is associated with the testing pin (2).

18. The device as claimed in claim 15, wherein a camera (12, 13) is associated with the testing pin (2).

19. A device for testing a printed circuit board comprising a testing pin (2) arranged on a holder (1), and including means for varying a location of the testing pin (2) variable to the holder (1), wherein an intrinsically active polymer (16) is associated with the testing pin (2).

20. The device as claimed in claim 19, wherein the intrinsically active polymer (16) is formed on the holder (1) and at least partially encloses the testing pin (2).

21. The device as claimed in claim 20, wherein a temperature-sensitive poly-(N-isopropyl acrylamide) (PNI-PAAm) is used as the intrinsically active polymer (16).

22. The device as claimed in claim 21, wherein the active intrinsically active polymer (16) is functionalized using special nanomaterials selected from the group consisting of layered silicates.

23. A method for moving an object (2) for testing, examining, and processing an electronic workpiece, by an item of equipment, wherein movement of the object (2) is performed by intrinsically active polymers (16).

24. The method as claimed in claim 23, wherein stimuli-sensitive hydrogels are used.

25. The method as claimed in claim 23, wherein a temperature-sensitive poly-(N-isopropyl acrylamide) (PNI-PAAm) is used as the intrinsically active polymer (16).

26. The method as claimed in claim 25, wherein the intrinsically active polymer (16) is functionalized using special nanomaterials selected from the group consisting of layered silicates.

27. The method as claimed in claim 25, wherein a parameter optimization of the intrinsically active polymer (16) is performed by variation of cross-linking conditions and specific modification of starting materials, degree of cross-linking, and porosity of cross-linking points.

28. The method as claimed in claim 27, wherein optimization of controllability of actuator materials is achievable by copolymerization of the N-isopropyl acrylamide or by variation of thermodynamic quality of the solvent.

29. The method as claimed in claim 27, including using radical photopolymerization wherein a hydrogel is not only synthesized but also micro-structured in a shaping manner.

* * * * *